United States Patent
McNair et al.

[11] Patent Number: 6,137,297
[45] Date of Patent: Oct. 24, 2000

[54] ELECTRONIC TEST PROBE INTERFACE ASSEMBLY AND METHOD OF MANUFACTURE

[75] Inventors: Michael P. McNair, Soquel; Louis H. Redondo; Nicholas M. Dimitropoulos, both of San Jose; Donald A. Meirhofer, Tuolome, all of Calif.

[73] Assignee: Vertest Systemsn Corp., San Jose, Calif.

[21] Appl. No.: 09/227,503

[22] Filed: Jan. 6, 1999

[51] Int. Cl.[7] .............................. G01R 1/073; H01R 43/00
[52] U.S. Cl. .............................. 324/754; 29/825; 324/757
[58] Field of Search .................................... 324/754, 757, 324/758, 761, 765; 29/825

[56] References Cited

U.S. PATENT DOCUMENTS

| | | | |
|---|---|---|---|
| 3,654,585 | 4/1972 | Wickersham | 439/65 |
| 4,899,099 | 2/1990 | Mendenhall et al. | 324/754 |
| 4,932,883 | 6/1990 | Hsia et al. | 439/66 |
| 5,172,050 | 12/1992 | Swapp | 324/72.5 |
| 5,225,037 | 7/1993 | Elder et al. | 216/18 |
| 5,475,317 | 12/1995 | Smith | 324/754 |
| 5,604,446 | 2/1997 | Sano | 324/754 |
| 5,625,298 | 4/1997 | Hirano et al. | 324/754 |
| 5,742,174 | 4/1998 | Kister et al. | 324/754 |
| 5,829,126 | 11/1998 | Nagao et al. | 324/757 |

*Primary Examiner*—Ernest Karlsen
*Attorney, Agent, or Firm*—H. M. Stanley

[57] ABSTRACT

An interface module for testing integrated circuits and a method of manufacture are disclosed wherein a planar self supporting diaphragm supports signal paths connected to a pattern of probe contacts extending therefrom which are in registration with a pattern of integrated circuit access pads. The diaphragm is resiliently connected to a planar printed circuit board in a plane substantially parallel to the plane of the printed circuit board. A floppy substrate is placed between the printed circuit board and the diaphragm to provide signal paths from the printed circuit board to the self supporting diaphragm.

The method includes laser location and drilling of holes to obtain a high density of accurately positioned small diameter holes in the self supporting diaphragm material to thereby accomplish high probe contact density in unlimited pattern arrays.

26 Claims, 3 Drawing Sheets

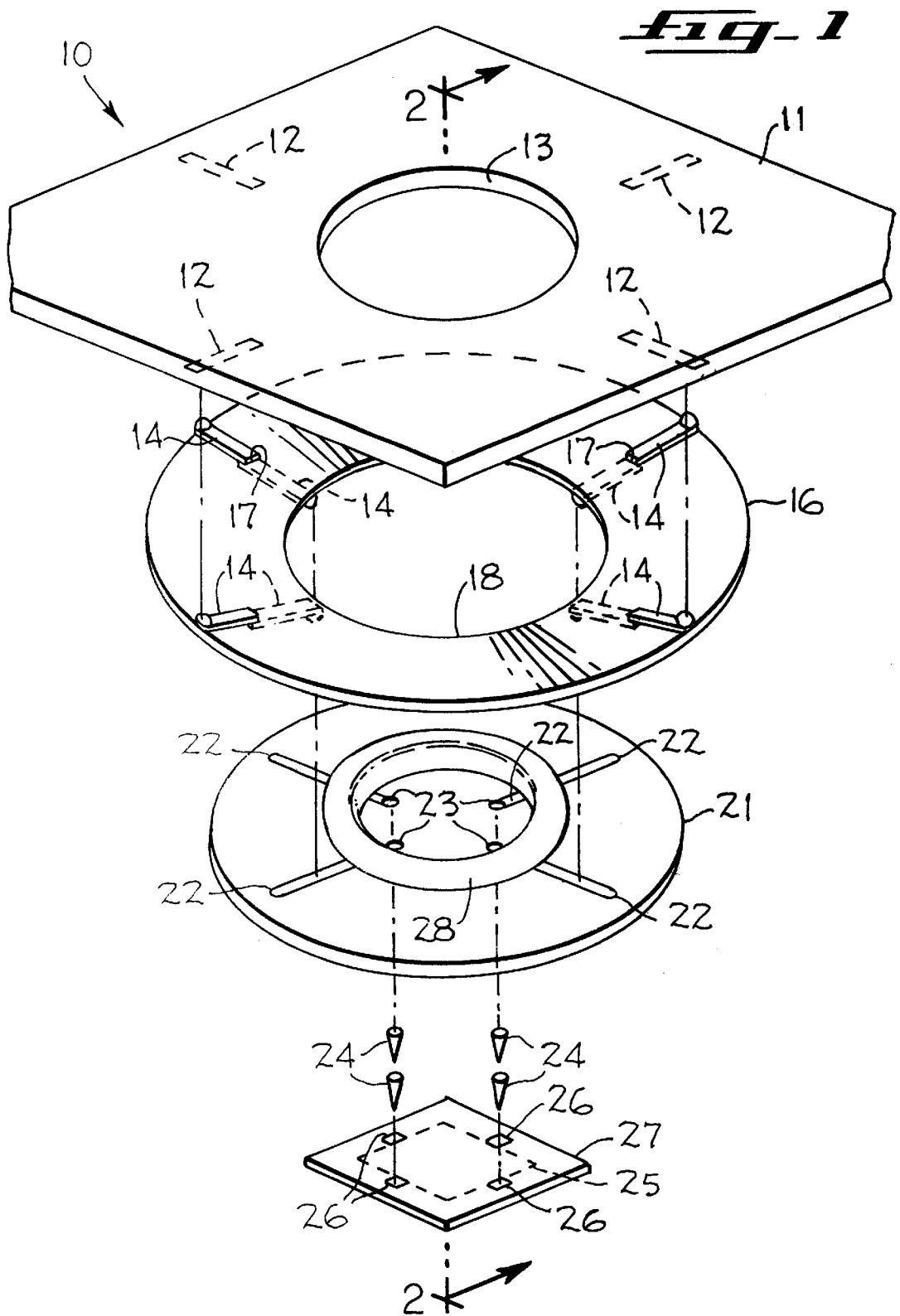

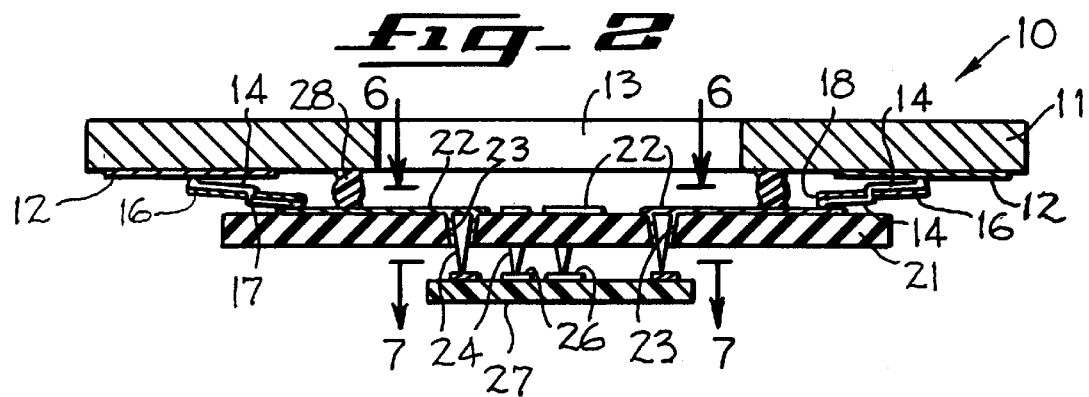
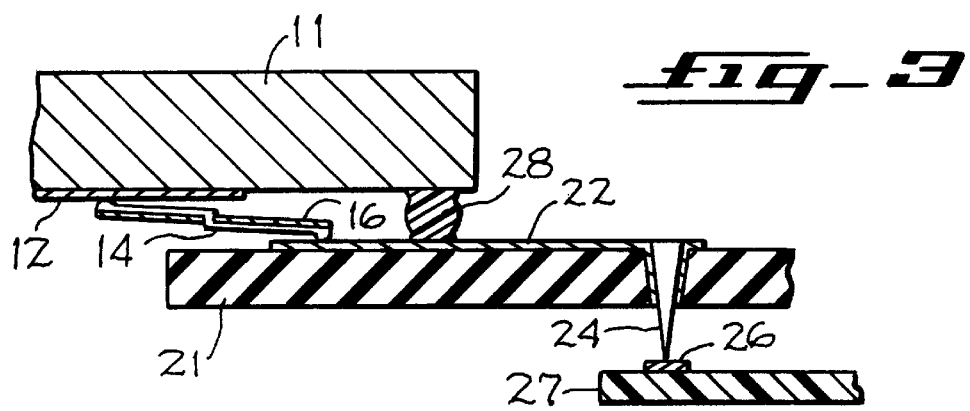
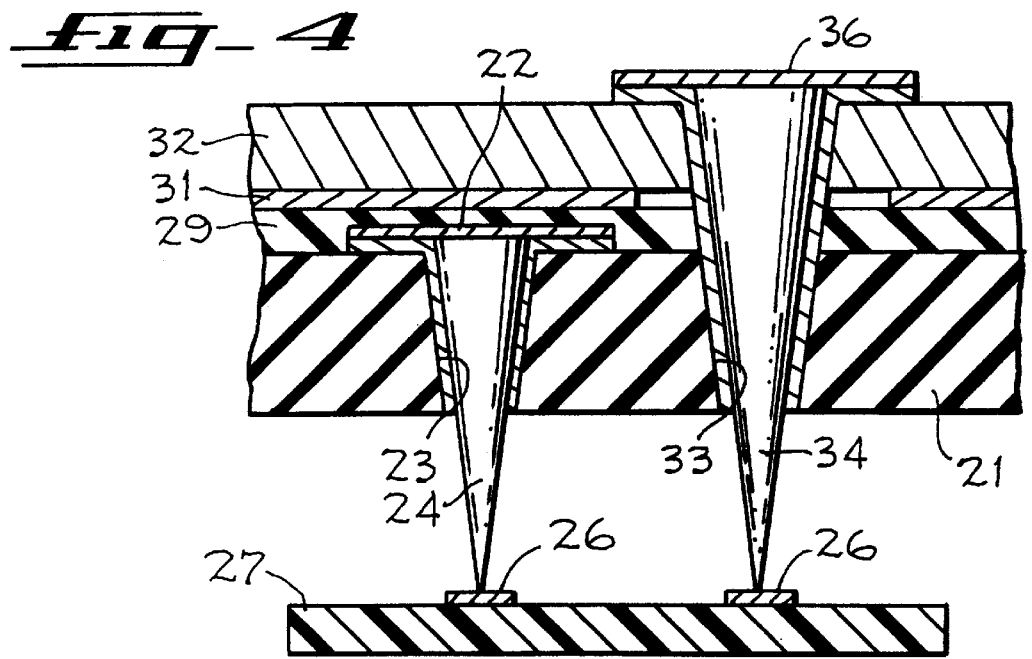

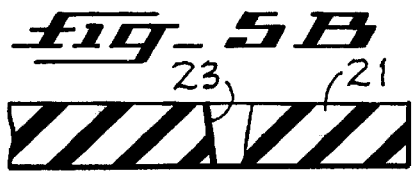
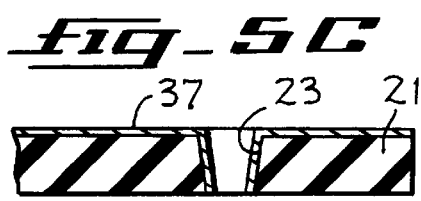
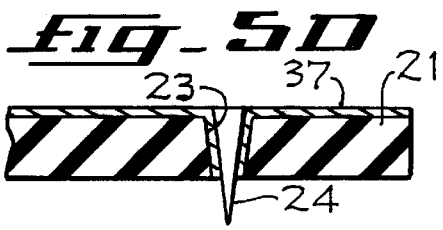
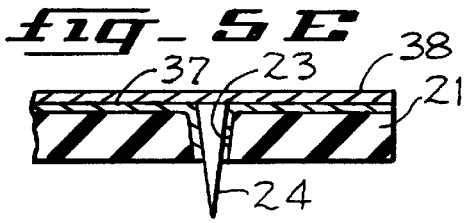
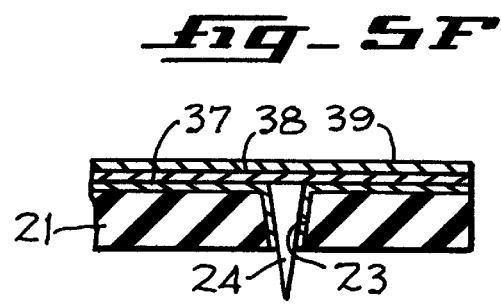
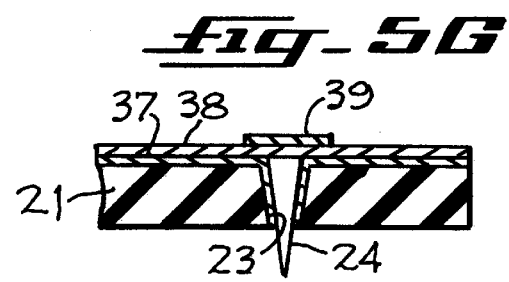
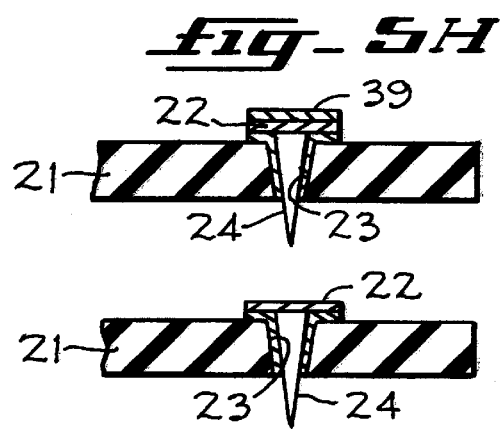
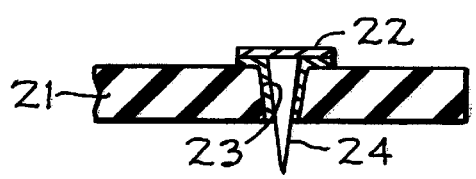
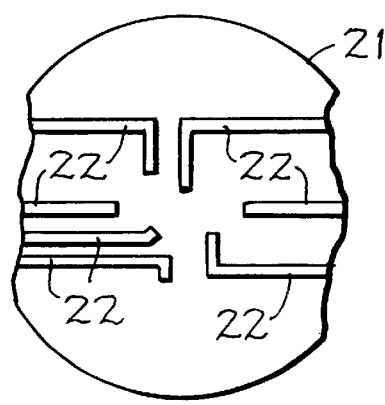
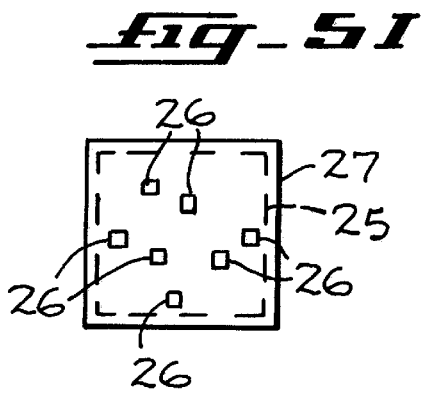

ELECTRONIC TEST PROBE INTERFACE ASSEMBLY AND METHOD OF MANUFACTURE

SUMMARY OF THE INVENTION

An interface is provided between terminals on an integrated circuit testing device and corresponding terminals on an integrated circuit to be tested. The integrated circuit has a predetermined pattern of test access pads. The combination includes a printed circuit board, a first plurality of conducting paths on the printed circuit board having test device ends configured for contacting ones of the terminals on the integrated circuit testing device. A floppy substrate is included and a second plurality of conducting paths is formed on the floppy substrate wherein the conducting paths have printed circuit board ends disposed for contact with ones of the opposing ends of the first plurality of conducting paths. A self supporting diaphragm is included with a third plurality of conducting paths on the self supporting diaphragm having conducting path ends disposed for contact with ones of the ends of the second plurality of conducting paths. Probe members are provided which extend from the self supporting diaphragm in a pattern corresponding to the predetermined pattern of test access pads. The probe members are connected to ones of the third plurality of conducting paths. Resilient means extends between the printed circuit board and the self supporting diaphragm.

In another aspect of the invention an interface apparatus is provided for connecting a plurality of tester terminals on an integrated circuit tester to an integrated circuit device which has a plurality of test access pads arranged in a predetermined pattern. A printed circuit board has a plurality of circuit board conducting paths thereon adapted for electrical contact on one end with ones of the plurality of tester terminals. A probe support diaphragm is provided having a plurality of probe support conducting paths thereon which have inner conductor ends and outer conductor ends. A plurality of probes is mounted on the probe support diaphragm disposed in a pattern corresponding to the predetermined pattern of integrated circuit device test access pads. The probes are connected to ones of the plurality of probe support conducting path inner ends. Resilient means is attached to and extends between the printed circuit board and the probe support diaphragm. A floppy ring extends between the printed circuit board and the probe support diaphragm in parallel with the resilient means. A plurality of conducting paths is formed on the floppy ring in contact with and extending between ones of the plurality of circuit board conducting paths and ones of the plurality of probe support conducting pads.

In yet another aspect of the invention an interface module is provided for connecting a plurality of tester terminals on a microcircuit tester to a plurality of substantially coplanar microcircuit access pads in a predetermined pattern on an integrated circuit. The combination includes a printed circuit board, a plurality of conducting paths on the printed circuit board disposed for electrical contact with ones of the plurality of tester terminals and a frustum surface shaped flexible membrane having a base adjacent the printed circuit board and an opening opposite the base. Further a plurality of conducting paths is formed on the flexible membrane, which paths extend from adjacent the base to adjacent the opening opposite the base and are in electrical contact with ones of the plurality of conducting paths on the printed circuit board adjacent the base. A diaphragm has an outer edge and an interior portion and a plurality of conducting paths which are formed on the diaphragm and which extend from positions toward the outer edge to positions toward the interior portion. The conducting paths on the diaphragm are in electrical contact at the positions toward the outer edge with ones of the plurality of conducting paths on the flexible membrane adjacent the opening opposite the base. A plurality of electrical contacts have tips which extend from the diaphragm in a pattern corresponding to the micro-circuit access pad predetermined pattern and which are in electrical contact with ones of the plurality of conducting paths on the diaphragm at the positions toward the interior portion. Resilient means surrounds the diaphragm interior portion and is attached to and extends between the printed circuit board and the diaphragm. In this fashion, the resilient means deflects to provide coplanarity between the tips on the plurality of electrical contacts and the microcircuit access pads. Further, the diaphragm itself deflects to provide contact between ones of the tips and ones of the micro-circuit access pads when local departure from coplanarity in the tips and micro-circuit access pads occurs.

A method of fabricating an interface module is disclosed which provides signal conducting paths between terminals on an integrated circuit testing device and a pattern of circuit access pads on an integrated circuit. The interface module has a printed circuit board providing contact with the terminals on the integrated circuit testing device and signal conducting paths thereon. The method includes the steps of forming a floppy ring shaped in the form of a surface of a frustum and depositing signal conducting paths on the floppy ring. Further, a planar self supporting diaphragm plate is formed and hole location and laser drilling is performed to provide a pattern of holes in the diaphragm plate in a pattern corresponding to the pattern of circuit access pads. Also included is the step of depositing signal conducting paths on the diaphragm plate wherein each conducting path has one end terminating at ones of the pattern of laser drilled holes. Pad contacts are inserted into ones of the pattern of laser drilled holes and the floppy ring is placed between the printed circuit board and the self supporting diaphragm plate in position so that ones of the floppy ring conducting paths are connected between ones of the printed circuit board and ones of the diaphragm plate signal conducting paths. The self supporting diaphragm plate is resiliently secured in a substantially parallel plane relationship with the printed circuit board. The pad contacts are adjusted so that the tips thereof lie in a plane substantially parallel to the planar self supporting diaphragm plate.

In a further form of the invention an interface is provided for connecting terminals on an integrated circuit tester with a predetermined pattern of circuit access pads on an integrated circuit wherein a printed circuit board has a base on a frustum shaped flexible substrate positioned adjacent thereto. a self supporting diaphragm is positioned adjacent to and extends across an end of the frustum opposite the base. Resilient means is connected to and extends between the printed circuit board and the self supporting diaphragm to maintain a substantially parallel planar relationship therebetween when the resilient means is in an unstressed condition. a plurality of probes is mounted in the self supporting diaphragm, which extend therefrom in a pattern corresponding to the predetermined pattern of circuit access pads. Conductive signal paths are on the printed circuit board, the frustum shaped flexible substrate and the self supporting diaphragm which provide communication between the integrated circuit tester terminals and the circuit access pads.

BRIEF DESCRIPTION OF THE DRAWINGS

FIG. 1 is an exploded view of the integrated circuit tester interface of the present invention.

FIG. 2 is a section along the line 2—2 of FIG. 1.

FIG. 3 is a partial section of the left side of FIG. 2.

FIG. 4 is an alternative embodiment of the present invention as seen in section through a central portion of the self supporting diaphragm.

FIGS. 5A–5I show steps in the process of obtaining holes in the self supporting diaphragm and positioning of contact pins in the holes.

FIG. 6 is a view along the line 6—6 of FIG. 2.

FIG. 7 is a view along the line 7—7 of FIG. 2.

DESCRIPTION OF THE PREFERRED EMBODIMENTS

Interface modules for connecting the terminals on an integrated circuit testing device to specific pads on an integrated circuit fall into several groups. One such group has contacts for making electrical connection to the integrated circuit access pads with individually flexible contacts. Buckling beam contacts or cantilevered arm contacts exemplify such contacts. Another general group is that wherein all of the contacts for the integrated circuit access pads flex together. Interface assemblies of this latter type are exemplified by those having flexible membranes on which the pad contacting contacts are carried, which also require a backup support member for the membrane to provide sufficient strength in the membrane. Alternatively, when rigid type membranes with sufficient internal strength have been utilized, it is generally difficult to acquire a high density of probes in the rigid membrane due to the difficulty of forming holes therein at sufficiently close intervals to acquire a high density of probes and at the same time obtain probes having sufficient strength characteristics to provide for a sufficient number of repetitive test cycles.

Probe cards requiring a high density of probes for integrated circuit or electronic circuit (the terms 'integrated' and 'electronic' are used interchangebly in this specification) testing are often manufactured by hand and the probes on the cards must be precisely positioned manually. Adjacent probes must be spaced a particular distance apart to assure they will not electrically contact one another. Further, the tips of the probes must be in a common plane to assure that all the probes will contact the pads on the integrated circuits being tested simultaneously with substantially identical force on each pad. This assures good electrical contact and reliable testing. Alternatively, if the probes engage the integrated circuit pads with excessive force, the pads, and therefore the integrated circuits, may be damaged. Additionally, since the probe cards of this type are fabricated manually, there is a high probability that such probe cards will not have identical or even similar characteristics. The cost of such cards is predictably high.

The probe card of the present invention is assembled more efficiently and the probe contact positioning is obtained with a higher degree of accuracy due to the automated manner in which the probes are located and the higher density of probes achievable through the method of the present invention. Additionally, though the procedure places the probe tips in coplanar relationship, the probe card and method of manufacture relating to the present invention affords individual probe displacement to compensate for integrated circuit pad height (local) variation as well as collective probe tip planar adjustment to compensate for (general) variation between the plane of the integrated circuit access pads and the plane of the probe mounting diaphragm of the present invention.

Referring to FIG. 1 of the drawings, an exploded view of a test probe interface 10 of the present invention is shown having a printed circuit board 11 with conductive signal paths 12 on the bottom surface thereof as shown, and having ends of the conductive paths extending toward the periphery of the printed circuit board 11. The peripheral ends of the conducting paths 12 are placed to contact terminals on an integrated circuit tester device (not shown). A hole 13 is shown centrally located in the printed circuit board 11 in this embodiment of the invention to provide visibility for ease of assembly.

The inner ends of the conducting paths 12 are configured to contact the ends of a plurality of conducting paths 14 located on a floppy ring 16 of thin dielectric material which has the shape of a surface on a frustum The base of the frustum is adjacent the underside of the printed circuit board 11. The floppy ring is fabricated of some dielectric materials such as polyimide. The conductive paths 14 on the floppy ring 16 are seen to be formed on the upper side of the ring 16 from the outer periphery thereof to a point midway through the radial width of the ring. The paths 14 are there led through vias 17 to the underside of the ring 16 (FIG. 1) toward the inner edge of an opening 18 in the frustum opposite from the base of the frustum. The conducting paths 14 on the underside (FIG. 1) of the floppy ring 16 are configured to contact conducting paths 22 on a self supporting diaphragm 21 at an outer end of the conducting paths 22. The conducting paths 22 proceed toward an interior portion of the self supporting diaphragm 21 and terminate at through drilled holes 23. The drilled holes 23 are small in diameter, approximately 0.002 to 0.003 inches, and are formed in a manner and are shaped as will be hereinafter described. A needle type contact 24 is shown in FIG. 1, which is set in each of the holes 23 in electrical contact with the conductive paths 22. The needle contacts 24 are preferably fabricated from tungsten or copper wire. The needles 24 in FIG. 1 function as contact probes and are disposed in the self supporting diaphragm 21 in a pattern which corresponds to a pattern of circuit access pads 26 seen on an integrated circuit chip 27 to be tested. The integrated circuit itself is represented in FIG. 1 by the enclosed dashed lines 25. An elastomer ring 28 is shown lying on the upper surface of self supporting diaphragm 21 in FIG. 1. The elastomer ring 28 adheres to the surface of self supporting diaphragm 21 on which it lies as well as to the undersurface of the printed circuit board 11 which it contacts inside the diameter of the central hole 18 in the floppy ring 16. The elastomer ring is preferably Dow Corning 100% Silicone.

FIG. 2 shows a section through the assembly of FIG. 1 wherein the vertical dimensions as seen in FIG. 2 are slightly enlarged for purposes of clarity and to add some probe contacts 24 as they would appear to address the pattern of circuit access pads seen in FIG. 7. The test probe interface 10 is seen having the printed circuit board 11 with the signal conducting paths 12 formed on the underside thereof The frustum substrate or conical ring 16 is shown having signal conducting paths 14 thereon with an upper end in contact with the signal conducting paths 12 on the printed circuit board and a lower end being in electrical contact with the outer end of signal conducting path 22 on the self supporting diaphragm 21. FIG. 2 shows the vias 17 that allow the signal conducting paths 14 to migrate from the upper side of the frustum or floppy ring 16 to the underside thereof to thereby provide the aforementioned electrical contact with signal paths 12 and 22. The self supporting diaphragm 21 is shown attached to the underside of the printed circuit board 11 by the resilient ring 28. The frustum is shaped to maintain contact between the ends of the conducting paths 14 and 12 and 14 and 22 as pressure is exerted against the base of the frustum and the periphery of the hole 18 therein which lies opposite the base. The pressure is maintained by an appropriate spacing between the lower surface of the printed circuit board 11 and the upper surface of the self supported diaphragm 21. Alternatively, the ends of the conducting paths 14 and 12 and 14 and 22 are held in contact using solder or conductive epoxy, such as electronics grade silver or gold-filled epoxy. The spacing between board 11 and diaphragm 21 is maintained by the resilient ring 28 and care is taken to maintain the board 11 and the diaphragm 21 within parallel planes at assembly. It may be seen in FIG. 2 from the cross section of the resilient ring that the greatest dimension thereof extends between the lower surface of the printed circuit board 11 and the upper surface of the self supported diaphragm 21. The holes 23 are prepared as will be hereinafter explained and the needle type probe contacts 24 are fixed therein in electrical contact with the signal conducting paths 22 on the upper surface of the diaphragm 21. The tips of the probe contacts 24 are placed in coplanar relationship through a process to be hereinafter described and are therefore available in a pattern corresponding to the pattern of the circuit access pads 26 surrounding the integrated circuit 25 on the semiconductor device 27. It is seen from the foregoing that the resilient means 28 will deflect to provide a generally coplanar relationship between the plurality of tips on the electrical contacts 24 and the plurality of microcircuit access pads 26. In addition, the self supporting diaphragm 21 is configured to deflect to provide contact between each of the tips on the plurality of probes 24 and corresponding ones of the microcircuit access pads 26. This feature comes into operation when local departure from a common plane occurs between the contact probe tips and the microcircuit access pads.

The partial section of FIG. 3 is closer to actual component part magnitudes than is the depiction of FIG. 2. The printed circuit board 11 is shown with the underside signal conducting paths 12 in contact with the signal conducting paths 14 on the floppy ring 16 which appears as a frustum in this embodiment. Contact is shown between the signal conducting path 14 and the conducting path 22 formed on the surface of the self supporting diaphragm 21. The probe contact or needle 24 is shown in FIG. 3 disposed at an angle to vertical in the depiction of FIG. 3 for the purpose of providing rubbing between the contact tips and the access pads when contact is made with the circuit access pads 26 on the integrated circuit 27. The rubbing results from an overdrive between the tips and pads of up to 0.004 inches when the probes are positioned on the pads. The is elastomeric ring 28 is shown in place in FIG. 3 to maintain the spacing between the board 11 and the diaphragm 21 and to also maintain the two elements in parallel planes. The resilient member 28, after being stressed, will return the printed circuit board 11 and the self supported diaphragm 21 to their assembled parallel plane positions. The floppy ring 16 is, in the best mode known to the inventors, thin polyimide with an electroplated metal signal conducting path pattern represented by the conducting paths 14 in the drawings. The self supporting diaphragm 21 is made of materials exhibiting high tensile strength, electrical insulation properties and low thermal expansion characteristics. Materials such as quartz and certain plastics fall within this category. The self supporting diaphragm is in the form of a disk or rectangle, according to the application, and has a certain elasticity which allows individual ones of the mounted contact probes to be moved slightly against the elastic resistance of the diaphragm when the probes are brought into contact with circuit access pads 26. On the other hand, the entire pattern of tips on the probe contacts 24 is allowed to be moved into coplanarity with the pattern of integrated circuit access pads 26 against the resilient force afforded by the resilient member 28. Quartz is a preferred material for the self supporting diaphragm 21 and has been used in thicknesses of 0.015 to 0.020 inches. Quartz also has appropriate dielectric properties, elasticity and tensile strength as well as a very low coefficient of expansion over a broad temperature range from cryogenic temperatures to elevated temperatures. Further, as will hereinafter be explained, quartz substrates can be manufactured to precise tolerances required in test probe interface assemblies. The assembly provided herein and illustrated in FIGS. 1 through 3 provides uniform "balanced contact force" at each probe tip. This means that each probe tip in the array of contact probes 14 contacts the integrated circuit access pads 26 with substantially equal amounts of probe pressure. The contact probes 24 have been found to perform well over repeated contact cycles when fabricated from the aforesaid tungsten or copper materials, because each material has excellent electrical conductivity and abrasive wear resistance.

Looking now at FIG. 4 of the drawings, an alternative embodiment of the present invention is shown. The self supporting diaphragm 21 is shown having holes 23 therethrough and contacts 24 mounted therein in electrical contact with signal conducting paths 22 as described hereinbefore. A dielectric film 29 is deposited on top of the self supported diaphragm 21 and the signal conducting paths 22. The dielectric film may be vapor deposited silicon nitride or a polysilicon dielectric. An electrically conducting ground plane 31 is deposited on top of the dielectric layer 29. An additional upper diaphragm layer 32 is fixed to the exposed surface of the ground plane 31. Holes 33 are drilled through the combination of layers just described in conjunction with this FIG. 4 and the holes are plated. Additional probe contacts 34 are placed in the holes 33, electrically fastened therein and overlayed with additional upper signal conducting paths 36. In this fashion, the impedance of the conducting paths 22 is controlled by the thickness of the dielectric layer 29 which separates the signal conducting paths 22 from the ground plane 31. Additionally, other patterns of signal conducting paths 36 are formed on the self supporting diaphragm assembly including diaphragm 21 and additional support member 32 so that additional probe contacts 34 may be added to the test probe interface assembly to contact additional access pads 26 for the integrated circuit 27. It should also be noted that the contact probes might take on any pattern configuration, including patterns of contact pads 26 wherein pads 26 may exist at the periphery of the integrated circuit 27 or at any points internally thereof The assembly of FIG. 4 functions as does the assembly depicted by FIGS. 2 and 3.

Looking at FIG. 5A, a self supporting diaphragm substrate 21 is shown, which as has been mentioned hereinbefore, is a quartz material in a preferred embodiment. As seen in FIG. 5B, the hole 23 in the diaphragm 21 has a conical shape. The hole 23 is formed by using a low power carbon dioxide laser to drill through the diaphragm. This laser drilling produces holes 23, which range from 0.003 to 0.002 inches in diameter. The laser beam is optically focused and located and the lower power beam is able to drill holes having such small diameters because of its smaller beam diameter. It should be noted that an exemir laser works so well on Ultem 1000™ material manufactured by Westlake Inc., which is a high temperature plastic and which is stable dimensionally over a relatively wide temperature range. The Ultem 1000™ material has been used to make the diaphragm 21 for lesser temperature and tolerance applications. For extremely wide temperature ranges, however, the quartz material for the diaphragm 21 is preferred and the low power carbon dioxide laser is utilized for drilling holes 23. The quartz material has been empirically found to have an ideal modulus of elasticity, dielectric properties temperature coefficient of expansion for the application described herein.

As seen in FIG. 5C the upper surface and the hole surfaces in the diaphragm 21 are coated with a copper layer 37. A contact probe such as the needle 24 is inserted into the plated hole 23 as seen in FIG. 5D. The contact probe 24 is seen as a conical member in the figures having a wider apex angle than actually used for purposes of illustration. It should be noted that the contact probe 24 could be formed by deposition of a conducting metal through the plated hole 23 to form the contact probe. Probes 24 in a finished state extend approximately 0.005 to 0.015 inches from the lower surface of the diaphragm 21. The contact probes are preferably in the range of 0.025 to 0.050 inches in overall length. The thickness of the quartz diaphragm ranges from 0.015 to 0.020 inches in a preferred embodiment. The Ultem 1000™ material will vary in thickness from 0.020 to 0.040 inches while functioning as described herein. Unsupported smaller dimensions in the diaphragms, whether the diaphragm is a circular disc or a rectangle, vary from approximately 2 to 5 inches.

An additional conducting layer 38 is deposited on top of the copper layer 37 as seen in FIG. 5E. This layer 38 is in electrical contact with the probe contact 24 and secures the probe contact within the plated hole 23. A photoresist layer 39 is deposited on top of the conducting layer 38 as seen in FIG. 5F. The photoresist layer 39 is partially removed to leave a pattern of photoresist on top of the conducting layer 38 which is representative of the pattern of signal conducting paths 22 to be formed on the upper surface of the self supporting diaphragm 21. Copper layers 38 and 37 are etched away from the upper surface of diaphragm 21 except that portion of the two copper layers which underlie the pattern of photoresist 39 as seen in FIG. 5H. The pattern of conductive layers 38 and 37 remaining after the etch represented in FIG. 5H is the pattern of signal conducting paths 22 on the diaphragm 21. When the photoresist layer 39 is removed, the signal conducting path and probe contact pattern represented by the conducting paths 22 and the contact probes 24 remain on the self supporting diaphragm 21 as described hereinbefore and as shown in FIG. 5I.

A partial plan of the self supporting diaphragm 21 is shown in FIG. 6 wherein a plurality of signal conducting paths 22 are shown terminated at various positions in the interior portion of the diaphragm. Probe contacts 24 extend from the lower surface of diaphragm 21 (not shown in FIG. 7) the aforementioned distance of 0.005 to 0.015 inches. An integrated circuit device 27 is shown in FIG. 7 having a plurality of substantially coplanar circuit access pads 26 located on the periphery of the circuitry 25 as well as at various points within the interior of the circuitry.

The depiction of FIG. 6 shows a plurality of signal conducting paths 22 having ends within the interior of the self supporting diaphragm 21. The contact probes 24, formed by the contact needles shown in the figures, or by plated through contacts as mentioned hereinbefore, extend from the underside of the diaphragm 21 in a pattern corresponding to the pattern of integrated circuit access pads 26 shown in FIG. 7. It may thus be seen that the invention described herein will provide probe contacts which may be brought to bear on any integrated circuit access pads 26 wherever they may lie throughout the surface of the integrated circuit 27. The density of the contact probes 24 is increased by the ability to drill very small holes (0.002 to 0.003 inches diameter) in the self supporting substrate 21 on approximately 0.004 inch centers to receive probe contacts therein. The accuracy of hole location and the decrease in size of hole diameters provided by the laser drilling techniques in materials disclosed herein provide accurate high density probe contact patterns which are repeatable among test probe interface assemblies and which provide for proper and positive probe contact forces on each of the integrated circuit access pads in a predetermined pattern of access pads.

A method of fabricating an interface module is provided which affords signal conducting paths between terminals on an integrated circuit testing device and a pattern of circuit access pads on an integrated circuit. The interface module has a printed circuit board that provides contact with the terminals on the integrated circuit testing device and further has signal conducting paths thereon. The method includes the steps of forming a floppy ring shaped in the form of a surface of a frustum and depositing signal conducting paths on the floppy ring. Further, the process includes the formation of a planar self supporting diaphragm plate. Laser location and drilling of a pattern of holes in the diaphragm plate follows, wherein the pattern of holes corresponds to the pattern of circuit access pads. The step of depositing signal conducting paths on the diaphragm plate wherein one end of each conducting path terminates at one of the holes in the pattern of laser drilled holes is followed by inserting pad contact probes into each of the holes in the pattern of laser drilled holes. Placing the floppy ring between the printed circuit board and the self supporting diaphragm plate, the floppy ring frustum is held therebetween by spacing the printed circuit board and the diaphragm plate to provide pressure between the conducting paths on the printed circuit board and the ends of conducting paths on the floppy ring at the base of the frustum as well as providing pressure between the conducting paths on the floppy ring at the opposing end of the frustum and conducting paths on the diaphragm plate. Alternatively, the conducting paths are connected with conductive epoxy, which in turn holds the floppy ring frustum in place. The printed circuit board and the self supporting diaphragm plate are fixed in this spaced condition in parallel planes by a resilient adhesive member disposed therebetween. The process includes the step of adjusting the tips of the pad contacts so that the tips lie in a plane substantially parallel to the plane of the diaphragm plate. The floppy ring 14 has sometimes been called a flexible circuit interposer.

What is claimed:

1. An interface between terminals on an integrated circuit testing device and corresponding terminals on an integrated circuit to be tested and having a predetermined pattern of test access pads, comprising
   a printed circuit board,
   a first plurality of conducting paths on said printed circuit board having test device ends configured for contacting ones of the terminals on the integrated circuit testing device and opposing ends,
   a floppy substrate,
   a second plurality of conducting paths on said floppy substrate having printed circuit board ends disposed for contact with ones of said opposing ends of said first plurality of conducting paths and having opposing ends,
   a self supporting diaphragm,
   a third plurality of conducting paths on said self supporting diaphragm having floppy substrate ends disposed for contact with ones of said opposing ends of said second plurality of conducting paths and having opposing ends, probe members extending from said self supporting diaphragm in a pattern corresponding to the predetermined pattern of test access pads and being connected to ones of said third plurality of conducting paths opposing ends, and resilient adhesive means extending between said printed circuit board and said self supporting diaphragm.

2. The interface of claim 1 wherein said floppy substrate comprises a continuous thin membrane having an outer periphery and an inner opening, said second plurality of conducting path printed circuit board ends being adjacent said outer periphery and said opposing ends being adjacent said inner opening.

3. The interface of claim 2 wherein said self supporting diaphragm comprises a quartz disc disposed across said floppy substrate inner opening.

4. The interface of claim 1 wherein said resilient adhesive means comprises cured silicone.

5. The interface of claim 1 wherein said resilient adhesive means comprises a cross section on said resilient adhesive means having a greatest dimension in the direction extending between said printed circuit board and said self supporting diaphragm.

6. Interface apparatus for connecting a plurality of tester terminals on an integrated circuit tester to an integrated circuit device having a plurality of test access pads arranged in a predetermined pattern, comprising a printed circuit board having a plurality of circuit board conducting paths thereon adapted for electrical contact on one end with ones of the plurality of tester terminals, a probe support diaphragm, a plurality of probe support conducting paths on said probe support diaphragm having inner ends and outer ends, a plurality of probes mounted on said probe support diaphragm disposed in a pattern corresponding to the predetermined pattern of integrated circuit device test access pads and being connecting to ones of said plurality of probe support conducting path inner ends, resilient means attached to and extending between said printed circuit board and said probe support diaphragm, a floppy ring extending between said printed circuit board and said probe support diaphragm in parallel with said resilient means, and a plurality of conducting paths on said floppy ring in contact with and extending between ones of said plurality of circuit board conducting paths and ones of said plurality of probe support conducting paths.

7. The interface apparatus of claim 6 wherein said probe support diaphragm comprises a quartz plate.

8. The apparatus of claim 7 wherein said quartz plate has a thickness to smaller unsupported lateral dimensions ratio in the range of 0.01 to 0.003.

9. The interface apparatus of claim 6 wherein said resilient means has a cross section having a greatest dimension extending between said printed circuit board and said probe support diaphragm.

10. The interface apparatus of claim 6 wherein said floppy ring comprises a thin frusto-conical sheet having a larger diameter adjacent said printed circuit board and a smaller diameter inner opening, first contact means at said larger diameter in pressure contact with said plurality of circuit board conducting paths, and second contact means adjacent said smaller diameter inner opening in pressure contact with ones of said plurality of probe support conducting path outer ends.

11. An interface module for connecting a plurality of tester terminals on a micro-circuit tester to a plurality of substantially coplanar micro-circuit access pads in a predetermined pattern on an integrated circuit, comprising a printed circuit board, a plurality of conducting paths on said printed circuit board disposed for electrical contact with ones of the plurality of tester terminals, a frustum surface shaped flexible membrane having a base adjacent said printed circuit board and an opening opposite said base, a plurality of conducting paths on said flexible membrane extending from adjacent said base to adjacent said opening opposite said base and being in electrical contact with ones of said plurality of conducting paths on said printed circuit board adjacent said base, a diaphragm having an outer edge and an interior portion, a plurality of conducting paths on said diaphragm extending from positions toward said outer edge to positions toward said interior portion and being in electrical contact at said positions toward said outer edge with ones of said plurality of conducting paths on said flexible membrane adjacent said opening opposite said base, a plurality of electrical contacts have tips extending from said diaphragm in a pattern corresponding to the micro-circuit access pad predetermined pattern, said tips on said plurality of electrical contacts being substantially coplanar, and resilient means surrounding said diaphragm interior portion attached to and extending between said printed circuit board and said diaphragm, whereby said resilient means deflects to provide coplanarity between said tips on said plurality of electrical contacts and said micro-circuit access pads, and said diaphragm deflects to provide contact between ones of said tips and ones of the micro-circuit access pads when local departure from coplanarity in said tips and micro-circuit access pads occurs.

12. The interface module of claim 11 wherein said diaphragm comprises a quartz plate.

13. The interface module of claim 11 wherein said electrical contacts comprise a plurality of conical needles, and wherein said diaphragm has a plurality of through conical holes for receiving said conical needles.

14. The interface module of claim 11 wherein said resilient means comprises a cross section on said resilient means having a greatest dimension extending between said printed circuit board and said diaphragm.

15. The interface module of claim 11 wherein said plurality of conducting paths on said diaphragm comprises multiple layers of conducting paths, and an insulating layer disposed between each of said multiple layers of conducting paths.

16. The interface module of claim 15 wherein said insulating layer has a predetermined thickness for impedance control.

17. The interface module of claim 11 wherein said diaphragm has a thickness to smaller unsupported plate dimension ratio which is greater than 0.003.

18. The interface module of claim 11 wherein said diaphragm has a modulus of elasticity at least as great as the modulus of elasticity of quartz.

19. A method of fabricating an interface module for providing signal conducting paths between terminals on an integrated circuit testing device and a pattern of circuit access pads on an integrated circuit, wherein the interface module has a printed circuit board providing contact with the terminals on the integrated circuit testing device and signal conducting paths thereon, comprising the steps of forming a floppy ring shaped in the form of a surface of a frustum, depositing signal conducting paths on the floppy ring, forming a planar self supporting diaphragm plate, locating and laser drilling a pattern of holes in the diaphragm plate in a pattern corresponding to the pattern of circuit access pads, depositing signal conducting paths on the diaphragm plate having one end terminating at ones of the pattern of laser drilled holes, inserting pad contacts into ones of the pattern of laser drilled holes, placing the floppy ring between the printed circuit board and the self supporting diaphragm plate with ones of the floppy ring conducting paths connected between ones of the printed circuit board and ones of the diaphragm plate signal conducting paths, resiliently securing the self supporting diaphragm plate in substantially parallel plane relationship with the printed circuit board, and adjusting the pad contacts so that the tips thereof lie in a plane substantially parallel to the planar self supporting diaphragm plate.

20. The method of claim 19 wherein the step of forming a planar diaphragm plate comprises using quartz, and the step of laser drilling comprises the step of low power carbon dioxide laser drilling.

21. The method of claim 20 comprising the steps of drilling holes in the range of 0.002 to 0.003 inches diameter, and placing the holes on 0.004 inch spaced centers.

22. An interface for connecting terminals on an integrated circuit tester with a predetermined pattern of circuit access pads on an integrated circuit, comprising a printed circuit board, a frustum shaped flexible substrate having a base adjacent said printed circuit board, a self supporting diaphragm adjacent to and extending across an end of said frustum opposite said base, resilient means connected to and extending between said printed circuit board and said self supporting diaphragm for maintaining a substantially parallel planar relationship therebetween, a plurality of probes mounted in said self supporting diaphragm and extending therefrom in a pattern corresponding to the predetermined pattern of circuit access pads, and conductive signal paths on said printed circuit board, frustum shaped flexible substrate and self supporting diaphragm providing communication between the integrated circuit tester terminals and the circuit access pads.

23. The interface of claim 22 wherein said self supporting diaphragm comprises a crystalline material plate.

24. The interface of claim 23 wherein said crystalline plate comprises a quartz plate.

25. The interface of claim 22 wherein said plurality of probes have a density at least as dense as 0.004 inch on centers.

26. The interface of claim 22 wherein said resilient means has a cross section dimension which is greatest between said printed circuit board and said self supporting diaphragm.

* * * * *